(12) United States Patent
Ray et al.

(10) Patent No.: US 9,076,645 B1
(45) Date of Patent: Jul. 7, 2015

(54) METHOD OF FABRICATING AN INTERLAYER STRUCTURE OF INCREASED ELASTICITY MODULUS

(71) Applicant: GLOBALFOUNDRIES Inc., Grand Cayman (KY)

(72) Inventors: Shishir Ray, Clifton Park, NY (US); Sandeep Gaan, Clifton Park, NY (US); Jin Ping Liu, Ballston Lake, NY (US); Zhiguo Sun, Halfmoon, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/272,554

(22) Filed: May 8, 2014

(51) Int. Cl.
*H01L 21/31* (2006.01)
*H01L 21/02* (2006.01)

(52) U.S. Cl.
CPC .... *H01L 21/02112* (2013.01); *H01L 21/02123* (2013.01); *H01L 21/02216* (2013.01); *H01L 21/02255* (2013.01); *H01L 21/02203* (2013.01)

(58) Field of Classification Search
CPC .......... H01L 21/02112; H01L 21/02123; H01L 21/02216; H01L 21/02203; H01L 21/02255
USPC .................................. 438/783, 781
See application file for complete search history.

(56) References Cited

U.S. PATENT DOCUMENTS

| 6,784,092 | B2* | 8/2004 | Miyajima et al. ............. 438/623 |
| 8,741,787 | B2* | 6/2014 | Mayer et al. .................. 438/781 |
| 2010/0052115 | A1 | 3/2010 | McAndrew et al. |
| 2012/0282415 | A1 | 11/2012 | Vrtis et al. |

OTHER PUBLICATIONS

Volksen et al., "Laser Spike Annealing: A Novel Post-Porosity Treatment for Significant Toughening of Low-k Organosilicates", 1-4244-01-03-08/06—2006, IEEE, 3 pages.

* cited by examiner

*Primary Examiner* — Tu-Tu Ho
(74) *Attorney, Agent, or Firm* — Kevin P. Radigan, Esq.; Heslin Rothenberg Farley & Mesiti P.C.

(57) ABSTRACT

Circuit structure fabrication methods are provided which include: providing an interlayer structure above a substrate, the interlayer structure including porogens dispersed within a dielectric material; and pulse laser annealing the interlayer structure to form a treated interlayer structure, the pulse laser annealing polymerizing the dielectric material of the interlayer structure to form a polymeric dielectric material, that includes pores disposed therein. The pulse laser annealing facilitates increasing elasticity modulus of the treated interlayer structure by, in part, maintaining structural integrity of the treated interlayer structure, notwithstanding that there are pores disposed within the polymeric dielectric material which, for instance, facilitates reducing dielectric constant of the treated interlayer structure.

20 Claims, 10 Drawing Sheets

METHOD OF FABRICATING AN INTERLAYER STRUCTURE OF INCREASED ELASTICITY MODULUS

FIELD OF THE INVENTION

The present invention relates to methods for facilitating fabricating integrated circuits, and more particularly, methods for increasing elasticity modulus of an interlayer structure for use, for instance, in fabricating an integrated circuit structure.

BACKGROUND

As the density of semiconductor integrated circuits increases, and the corresponding size of circuit elements decreases, circuit performance may be dominated by resistive-capacitance (RC) delay, for instance, between interconnect layers. RC delay may be reduced by decreasing the overall capacitance of an integrated circuit, and its components. As the size of technology nodes continues to decrease, it is desirable to reduce or minimize RC delay by customizing interlayer dielectrics used between, for instance, adjacent metal layers of an interconnect structure.

BRIEF SUMMARY

The shortcomings of the prior art are overcome and additional advantages are provided through the provision, in one aspect, of a method for fabricating a circuit structure. The method includes: providing an interlayer structure above a substrate, the interlayer structure including porogens dispersed within a dielectric material; and pulse laser annealing the interlayer structure to form a treated interlayer structure, the pulse laser annealing polymerizing the dielectric material of the interlayer structure to form a polymeric dielectric material, wherein the polymeric dielectric material includes pores disposed therein, and the pulse laser annealing facilitates increasing elasticity modulus of the treated interlayer structure by, in part, maintaining structural integrity of the treated interlayer structure, notwithstanding the pores disposed therein.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Aspects of the present invention and certain features, advantages, and details thereof, are explained more fully below with reference to the non-limiting embodiments illustrated in the accompanying drawings. Descriptions of well-known materials, fabrication tools, processing techniques, etc., are omitted so as to not unnecessarily obscure the invention in detail. It should be understood, however, that the detailed description and the specific examples, while indicating embodiments of the invention, are given by way of illustration only, and are not by way of limitation. Various substitutions, modifications, additions and/or arrangements within the spirit and/or scope of the underlying inventive concepts will be apparent to those skilled in the art from this disclosure.

In one aspect, integrated circuit performance may be enhanced, for instance, by reducing or minimizing the resistive-capacitance (RC) delay between interconnect layers. RC delay may be reduced by decreasing the overall capacitance of an integrated circuit and its components. For instance, the overall capacitance of an integrated circuit may be reduced using insulating layers having pores or air gaps as interlayer structures between adjacent metal layers of the integrated circuit. As integration density and complexity of semiconductor integrated circuits increases, significant challenges may arise with the use of traditional porous insulating layers. These issues could negatively impact performance or yield of the integrated circuits. As one example, the traditional insulating layer may be formed via, for instance, a high temperature annealing process with parameters selected to facilitate achieving a desired porosity within the interlayer structure resulting in reducing a dielectric constant of the resultant interlayer structure. Disadvantageously, the high temperature annealing process could also result in collapsing and/or shrinking of the resultant interlayer structure which, in turn, could lead to a decrease in elasticity modulus of the resultant interlayer structure. This decrease in elasticity modulus of the resultant interlayer structure could, in turn, lead to circuit damage and instability during subsequent fabrication processing.

Generally stated, provided herein, in one aspect, is a method for increasing elasticity modulus of an interlayer structure for use, for instance, in fabricating an integrated circuit structure, and without negatively impacting its structural integrity. The method includes: providing an interlayer structure above a substrate, the interlayer structure including porogens dispersed within a dielectric material; and pulse laser annealing the interlayer structure to form a treated interlayer structure, the pulse laser annealing polymerizing the dielectric material of the interlayer structure to form a polymeric dielectric material, where the polymeric dielectric material includes pores disposed therein, and the pulse laser annealing facilitates increasing elasticity modulus of the treated interlayer structure by, in part, maintaining structural integrity of the treated interlayer structure, notwithstanding that there are pores disposed therein.

In one embodiment, the fabricating further includes processing the interlayer structure, prior to the pulse laser annealing of the interlayer structure, to facilitate degrading at least a portion of the porogens of the interlayer structure, leaving the pores disposed therein. Processing of the interlayer structure facilitates reducing the dielectric constant of the interlayer structure. In one example, the interlayer structure may have a reduced dielectric constant of about 2.0 and 3.0. In one implementation, the processing may include annealing the interlayer structure at a temperature of about 250° C. or less, prior to the pulse laser annealing of the interlayer structure.

In another embodiment, the pulse laser annealing may include pulse laser annealing the interlayer structure with a pulse laser duration which facilitates polymerizing the dielectric material to form the polymeric dielectric material, wherein the pulse laser annealing is selected to control an extent of polymerization of the dielectric material within the treated interlayer structure. In one example, the pulse laser duration may be within a range of about 10 to 200 nanoseconds, and the pulse laser annealing may be performed at a temperature within a range of about 500° C. to 1500° C. Further, the pulse laser annealing may include pulse laser annealing the interlayer structure using a pulse cycle time which facilitates maintaining structural integrity of the treated interlayer structure, wherein the pulse laser annealing is selected to inhibit degradation of the interlayer structure. Laser pulse time may further be selected to facilitate achieving a desired elasticity modulus for the treated interlayer structure. In one example, the treated interlayer structure may have an elasticity modulus within a range of about 3.0 GPa to 20.0 GPa. In one example, the dielectric material may be or include an organosilane precursor, and the porogen may be or include an alkenyl-containing precursor.

Further, fabricating the circuit structure may include forming at least one via opening within, at least in part, the interlayer structure, prior to the pulse laser annealing the interlayer structure, wherein the at least one via opening extends through the interlayer structure. In a further embodiment, after pulse laser annealing the interlayer structure, a conductive structure may be provided within the at least one via opening of the treated interlayer structure.

Reference is made below to the drawings, which are not drawn to scale for ease of understanding, wherein the same reference numbers used throughout different figures designate the same or similar components.

FIGS. 1A-1K depict one example of an enhanced method for increasing elasticity modulus of an interlayer structure for use, for instance, in fabricating an integrated circuit structure. Advantageously, as described below, elasticity modulus of an interlayer structure is increased, while the dielectric constant of the structure is reduced, in accordance with one or more aspects of the present invention.

Figure 1A:
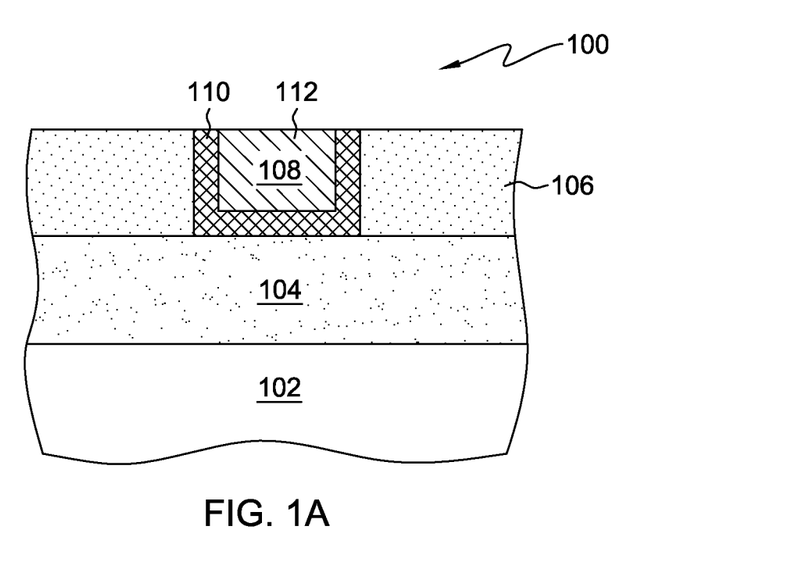
FIG. 1A is a partial cross-sectional elevational view of one embodiment of a circuit structure obtained during a fabrication process, in accordance with one or more aspects of the present invention.

Beginning with FIG. 1A, a partial elevational, cross-sectional view of one embodiment of an intermediate structure 100 is depicted. Intermediate structure 100 includes a substrate 102, such as a semiconductor substrate (for instance, a silicon substrate). As another example, substrate 102 may include any silicon-containing substrate including, but not limited to, silicon (Si), single-crystal silicon, polycrystalline Si, amorphous Si, silicon-on-nothing (SON), silicon-on-insulator (SOI), or silicon-on-replacement insulator (SRI) substrates or the like. The substrate may include other suitable elementary semiconductors, such as, for example, germanium (Ge) in crystal, or a compound semiconductor such as silicon carbide (SiC), gallium arsenide (GaAs), gallium phosphide (GaP), indium phosphide (InP), indium arsenide (InAs), and/or indium antimonide (InSb) or combinations thereof; or an alloy semiconductor including GaAsP, AlInAs, GaInAs, GaInP, or GaInAsP or combinations thereof.

During front-end of line (FEOL) processing, individual devices are created, for instance, in a device layer 104 disposed over substrate 102. As an example, these individual devices may include, for instance, metal-oxide-semiconductor field-effect transistors (MOSFETs) such as FinFETs, as well as capacitors, resistors and other semiconductor devices. These devices may be formed using various techniques, and their formation may include several steps of processing such as creating surface structures, isolating devices with shallow or deep trenches, forming n-type and p-type wells, providing gate structures, and fabricating source and drain conductive contact structures. Through these techniques, individual, unconnected (or at least partially connected) semiconductor devices may be fabricated in device layer 104.

After FEOL processing, as well as middle-of-the-line (MOL) processing, back-end of line (BEOL) processing is performed. By way of example, the BEOL processing may include, for instance, silicidation of source and drain regions, deposition of a pre-metal dielectric (PMD) layer, and formation of vias or trenches in the PMD layer. During BEOL processing, a pre-metal dielectric (PMD) layer 106 may be deposited and patterned with a network of interconnecting conductive structures (also referred to as interconnecting lines or wiring), for instance, to facilitate the desired interconnection of semiconductor devices in device layer 104 as required to implement a particular integrated circuit design. The deposition of pre-metal dielectric (PMD) layer 106, followed by subsequent processing to pattern, etch and fill trenches and vias with, for instance, conductive structures 108, may be repeated during BEOL processing such that several metal layers, for example, six to ten metal layers, are deposited and processed in a similar manner. Between each metal layer, interlayer structures may be formed to isolate signals from the various metal layers and to support structural integrity of the integrated circuit structure, including the metal layers and the interconnecting conductive structures such as trenches or vias. As an example, the interlayer structures may include one or more interlayer dielectrics.

By way of example, pre-metal dielectric layer 106 may be patterned using conventional etch processes, to define one or more interconnecting conductive structure(s) 108. The etch processes may include conventional anisotropic dry etching processing, for example, reactive ion etching or anisotropic wet etching processes. In one example, conductive structure 108 may include liners 110 deposited within the patterned openings. A liner refers generally to any film or layer which may include part of the resultant conductive structure, and include (for instance) one or more conformally-deposited layers, which may include titanium (Ti), carbon doped titanium, tungsten (W), tungsten nitride (WN), titanium nitride (TiN), tantalum nitride (TaN), titanium aluminum nitride (TiAlN) or the like. Liners 110 may be deposited using conventional deposition processes, for example, atomic layer deposition (ALD), chemical vapor deposition (CVD) or any other suitable process, and facilitate the forming of conductive structures 108 by the subsequent filling of the openings with a conductive material 112, such as a metal, such as copper, tungsten or the like. A non-selective chemical-mechanical polish may be employed to polish away excess liners 110 and conductive material 112, along with pre-metal dielectric layer 106 with the chemical-mechanical polishing terminating at, for instance, conductive structure(s) 108, resulting in the height of conductive structure 108 being substantially equal to height of pre-metal dielectric layer 106 as illustrated.

Figure 1B:
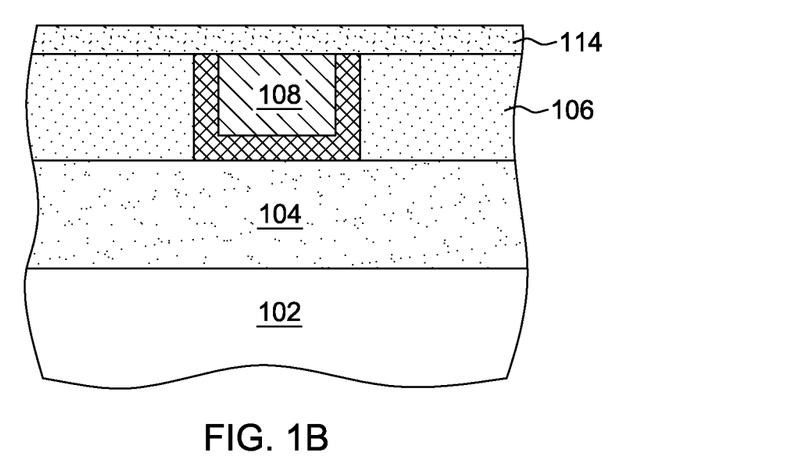
FIG. 1B depicts the structure of FIG. 1A with a capping layer having been provided over the structure, in accordance with one or more aspects of the present invention.

FIG. 1B illustrates the structure of FIG. 1A after providing a capping layer 114 over the structure. In one example, capping layer 114, may have a thickness in the range of about 5.0 to 50.0 nanometers, and may be deposited using conventional deposition processes such as, for instance, atomic layer deposition (ALD), chemical vapor deposition (CVD) or the plasma-enhanced versions of the same. Capping layer 114 may be or include a dielectric material such as, for instance, a nitrogen-doped or hydrogen-doped silicon carbide material (also referred to as an N-Blok material). In another example, capping layer 114 may also include or be fabricated of materials such as, for example, silicon nitride (SiN), silicon carbide (SiC), silicon carbonitride (SiCN) or a combination thereof. In a specific example, capping layer 114 may have a thickness of about 30 nanometers.

Figure 1C:
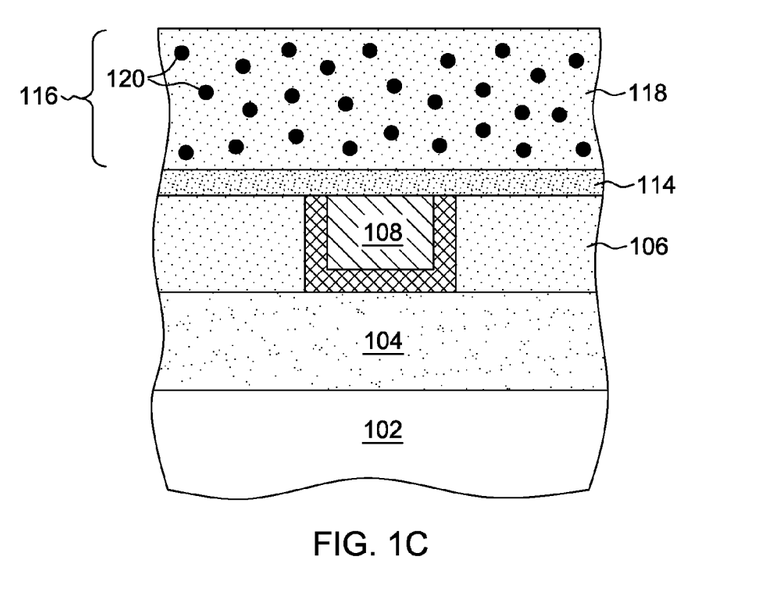
FIG. 1C depicts the structure of FIG. 1B after providing an interlayer structure, which includes porogens dispersed within a dielectric material, in accordance with one or more aspects of the present invention.

FIG. 1C depicts the structure of FIG. 1B after providing an interlayer structure 116 over the structure, in accordance with one or more aspects of the present invention. In one embodiment, interlayer structure 116 includes or is fabricated of a dielectric material 118 with porogens 120 dispersed therein. Dielectric material 118 may be deposited from a gaseous phase using chemical vapor deposition (CVD) such as, for example, plasma-enhanced CVD (PECVD), or from a liquid phase using a spin-on deposition process and, by way of example, may have a thickness in the range of about 50.0 to 500.0 nanometers. In one example, dielectric material 118 may include or be fabricated of an organosilane precursor having a general chemical formula $R^1{}_n(OR^2)_{3-n}Si$, where n=2 or 3, $R^1$ can be independently H, $C_1$ to $C_4$, linear or branched, saturated, singly or multiply unsaturated, cyclic, partially or fully fluorinated, $R^2$ can be independently $C_1$ to $C_6$, linear or branched, saturated, singly or multiply unsaturated, cyclic, aromatic, partially or fully fluorinated and $R^1$ may be different from $R^2$. In a specific example, the organosilane precursor may include, but not be limited to, diethoxymethylsilane (DEMS, having a chemical formula of $C_5H_{14}O_2Si$), dimethoxymethylsilane, di-isopropoxymethylsilane, dimethyldi-isopropoxysilane, dimethyoxymethylvinylsilane, tetraethoxysilane, 1,2-dimethyl-1-acetoxy-2-ethoxydisilane, vinyltriethoxysilane (VTEOS) and combinations thereof. In another example, dielectric material 118 may include or be fabricated of an organosiloxane precursor such as, for example, tetramethylcyclotetrasiloxane, octamethylcyclotetrasiloxane, pentamethylcyclopentasiloxane, hexamethylcyclotrisiloxane, dimethyldisiloxane, and combinations thereof.

Further, and as noted, interlayer structure 116 includes porogens 120 dispersed within dielectric material 118. Porogens 120 are particles that may be degraded, or removed leaving pores, using, for example, processing techniques such as discussed below with reference to FIG. 1F. For instance, porogens 120 may include or be fabricated of an alkenyl-containing precursor. In one example, the alkenyl-containing precursor may include, but not be limited to, alpha-terpinene (ATRP), bicyclo[2.2.1]hepta-2,5-diene (BCHD) (also referred to as 2,5-norbornadiene), para-cymene (PCM), trivertal. In another example, porogens may also include or be fabricated of polymers such as, for example, polymethylmethacrylate and other acrylates, polystyrene, poly(propylene oxide) and poly(ethylene oxide) derivatives. Note that porogens 120, which may also be nanoparticles, may be roughly spherical in shape, or may have irregular shapes and sizes, and may or may not be uniformly dispersed within dielectric material 118. In one example, two or more porogens 120 may be randomly in direct contact with one another, while in another example, porogens 120 may be uniformly distributed.

Figure 1D:
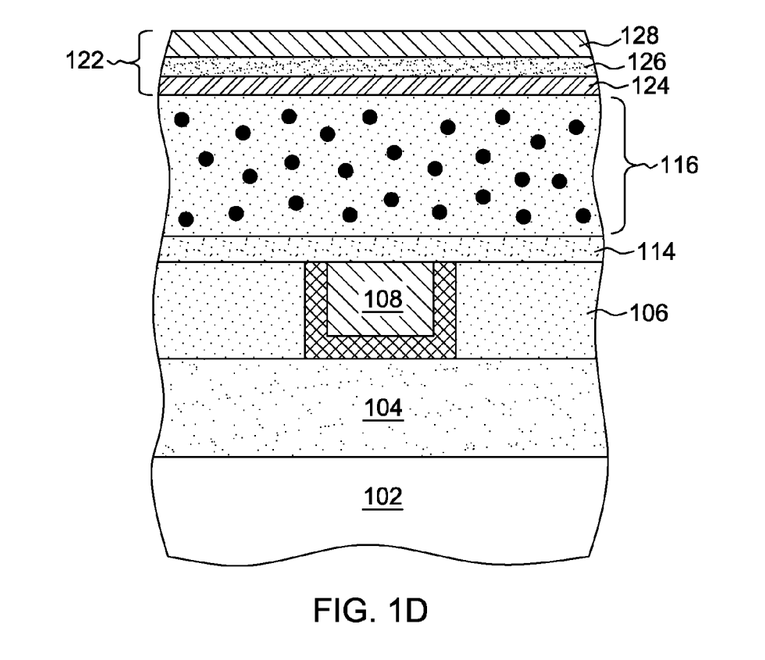
FIG. 1D depicts the structure of FIG. 1C with one or more protective layer(s) having been provided over the interlayer structure, in accordance with one or more aspects of the present invention.

FIG. 1D depicts the structure of FIG. 1C with one or more protective layer(s) 122 having been provided over interlayer structure 116. By way of example, protective layer(s) 122 may be used, in a subsequent processing step, to support patterning and forming of via opening(s) in the underlying interlayer structure 116. Protective layer(s) 122 may include, for instance, a first hard-mask layer 124 and a second hard-mask layer 126 disposed over first hard-mask layer 124. The deposition process may include any conventional process such as, for example, low temperature CVD, plasma-enhanced CVD or atomic layer deposition (ALD). In one example, first hard-mask layer 124, may have a thickness in the range of about 3.0 to 30.0 nanometers, and may include or be fabricated of one or more layers of silicon-containing materials or a carbon-containing materials. In one example, the silicon-containing material may include, for example, silicon oxide ($Si_xO_y$), silicon nitride ($Si_xN_y$), silicon oxynitride ($Si_xO_yN_z$), tetraethyl orthosilicate (TEOS), or octamethylcyclotetrasiloxane (OMCTS) layer, while the carbon-containing material may include, for example, silicon oxycarbide ($Si_xO_yC_z$) or carbon (diamond-like carbon (DLC), amorphous carbon (a-C) or graphite). In a specific example, first hard-mask layer 124 may be a layer of octamethylcyclotetrasiloxane (OMCTS) formed with a desired thickness, for instance, 15 nm. In another specific example, first hard-mask layer 124 may also be a layer of tetraethyl orthosilicate (TEOS) formed, for instance, by CVD processing to a desired thickness, for instance, 20 nm.

Continuing with FIG. 1D, second hard-mask layer 126 may be provided over first hard-mask layer 124. In one embodiment, second hard-mask layer 126 may have a thickness in the range of about 5.0 to 50.0 nm, and may be deposited using any conventional deposition processes such as CVD, PVD or ALD. By way of example, second hard-mask layer 126 includes or is fabricated of a metal or a metal-containing material. Second hard-mask layer 126 may be or include, for example, titanium (Ti), titanium nitride (TiN), tantalum nitride (TaN), tantalum (Ta), aluminum (Al) or aluminum-copper alloy (Al—Cu). In one specific example, second hard-mask layer 126 may have a thickness in the range of about 40 nanometers. An additional layer of a third hard-mask material 128 may optionally be provided over second hard-mask layer 126. In one embodiment, third hard-mask layer 128 may include or be fabricated of a silicon-containing material, a carbon-containing material, a metal or a metal-containing material.

Figure 1E:
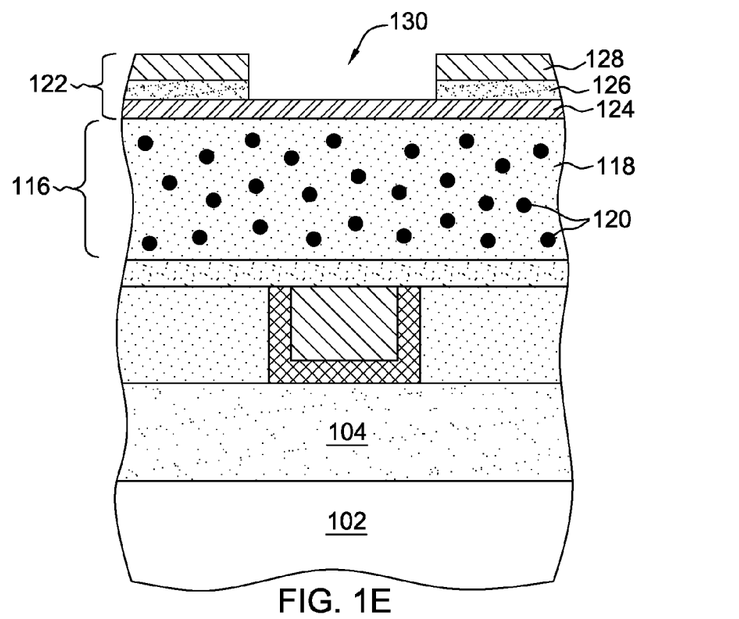
FIG. 1E depicts the structure of FIG. 1D after partial patterning of the protective layer(s), in accordance with one or more aspects of the present invention.

One or more etch processes may be performed to pattern protective layer(s) 122 (see FIG. 1D), forming one or more openings 130 within protective layer(s) 122, as depicted in FIG. 1E. By way of example, these one or more etch processes may include one or more hard-mask open steps, which may be performed employing any conventional etch process, such as an anisotropic etching process or an isotropic etching process. Note that, in one implementation, the one or more hard-mask open step(s) extends through optional third hard-mask layer 128 and underlying second hard-mask layer 126, stopping on first hard-mask layer 124. In one example, one or more etch processes may be utilized at this stage, including (for example) an anti-reflective coating open step, an optical dispersion layer open step, and one or more hard mask open steps.

Figure 1F:
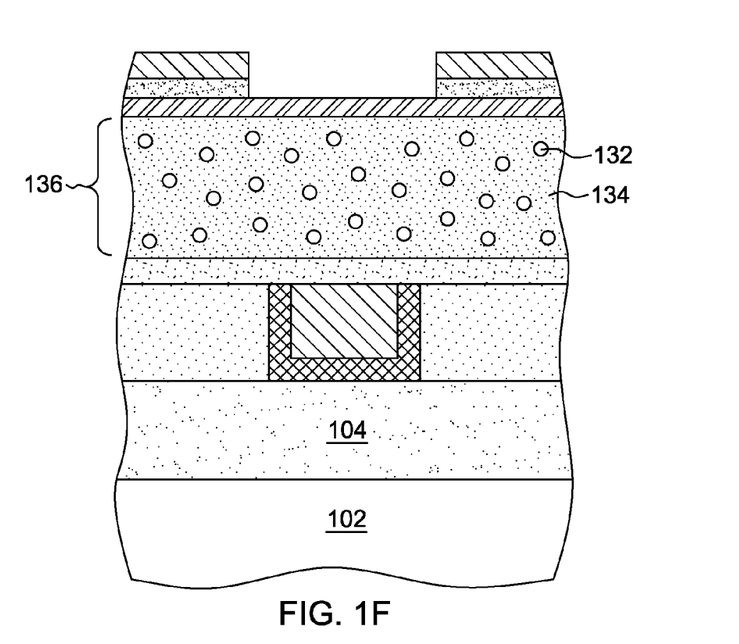
FIG. 1F depicts the structure of FIG. 1E with a treated interlayer structure having been formed after pulse laser annealing the interlayer structure, in accordance with one or more aspects of the present invention.

Referring to FIG. 1F, the structure may be subjected to one or more processing steps to facilitate degrading at least a portion of the porogens dispersed within the interlayer structure, leaving pores 132 therein. In one example, the pores may have a diameter or critical dimension of approximately about 0.3 to 2.0 nanometers. By way of example, the one or more processing steps to degrade the porogens may include annealing the interlayer structure 116 by applying a chuck or wafer pedestal temperature of about 250° C., using any suitable thermal enhancing processing steps. One skilled in the art will recognize that the depicted structure may be placed on a pedestal or other conventional support system such as, for example an electrostatic, vacuum or mechanical chuck in a process chamber. Upon increasing the pedestal temperature during one or more processing steps, at least a percentage of degradable porogens 120 (FIG. 1E) of interlayer structure 116 (FIG. 1E) may transition into a gaseous phase and migrate or bubble through the interlayer structure, thereby leaving the depicted structure. The resulting pores 132 may be filled with air or another gas, or may have a partial vacuum therein, depending on the process conditions used. Because the dielectric constant of air or vacuum is approximately one (1), the formation of pores 132 facilitates reducing the dielectric constant of the interlayer structure. In one example, the reduced dielectric constant of the interlayer structure may be within a range of about 2.0 to 3.0.

Continuing with FIG. 1F, a pulse laser annealing process may be performed over the structure, and in particular, over the dielectric material of the interlayer structure. In one embodiment, the pulse laser annealing facilitates causing an interaction between chemically unstable reactive species disposed within the dielectric material, resulting in polymerizing the dielectric material of the interlayer structure to form polymeric dielectric material 134. Note that as discussed above, polymeric dielectric material 134 includes pores 132 disposed therein, which results in a treated interlayer structure 136. The pulse laser annealing of the interlayer structure may be performed by, for instance, controlling process parameters such as, pulse laser energy and laser pulse duration to facilitate removal of only the chemically unstable reactive species of the dielectric material, thereby controlling the extent of polymerization of the dielectric material disposed within treated interlayer structure 136. In one example, the pulse laser annealing may be performed in the presence of process gases such as, for instance, carbon dioxide ($CO_2$) employing a laser pulse duration in the range of about 10 to 200 nanoseconds and at a temperature within a range of about 500° C. to 1500° C. Note that in this example, controlling laser pulse duration of each individual laser pulse facilitates controlling the extent of polymerization of the dielectric material, notwithstanding that there are pores 132 disposed within the polymeric dielectric material 134.

Additionally, note that the penetration of pulse laser energy within the interlayer structure depends on process parameters such as, for instance, pulse cycle time, wavelength employed during the process and pulse laser length (also referred to as pulse laser width). Note that, in this example, the pulse laser annealing of the interlayer structure advantageously facilitates altering, for instance, molecular polarizabilities of chemically unstable reactive species inherent within the dielectric material, thereby improving chemical cross-linking bonds of the polymeric dielectric material 134. This, in turn, facilitates maintaining the structural integrity of the treated interlayer structure 136 without collapsing and/or shrinking of the polymeric dielectric material, notwithstanding that there are pores 132 disposed therein. Such maintaining of the structural integrity of the treated interlayer structure advantageously facilitates maintaining or slightly enhancing elasticity modulus of the treated interlayer structure 136. In one example, the treated interlayer structure 136 may have an elasticity modulus within a range of about 3.0 to 20.0 GPa, and in one specific example, the pulse laser annealing may be performed employing an infrared (IR) laser beam with a wave length of about 1064 nm for a pulse laser duration of about 200 nanoseconds at a temperature of about 500° C. In another specific example, the pulse laser annealing may be performed employing a green laser beam with a wavelength of about 532 nm for a pulse laser duration of about 20 to 200 nanoseconds at a temperature of about 500° C. to 1400° C.

Figure 1G:
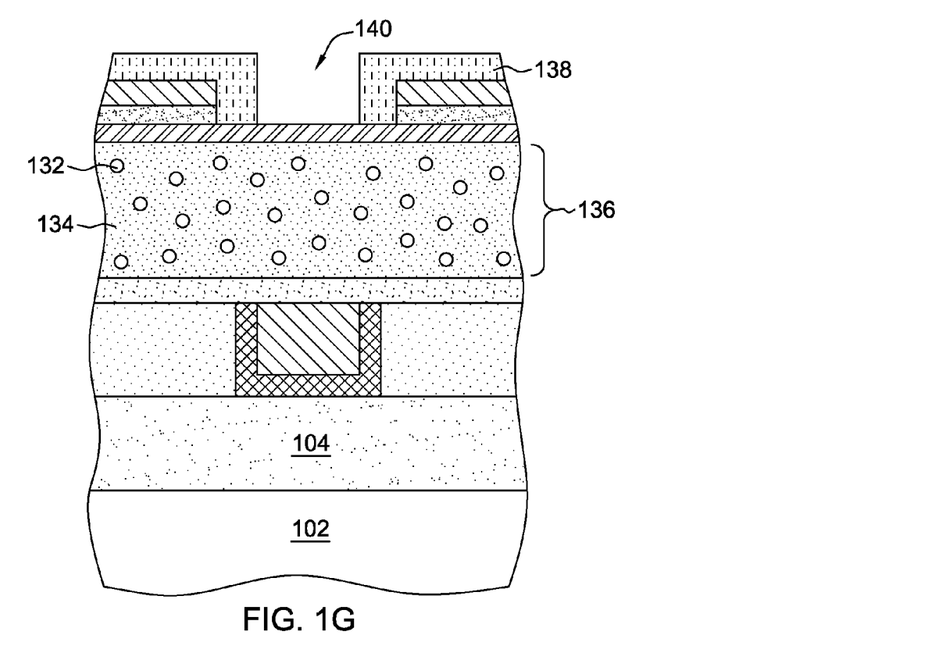
FIG. 1G depicts the structure of FIG. 1F after providing a lithographic stack over the partially patterned protective layer(s) and patterning of the lithographic stack, in accordance with one or more aspects of the present invention.

As depicted in FIG. 1G, a patterned lithographic stack 138 may be provided over the structure, and in particular, over partially patterned protective layer(s. Note that, in one embodiment, patterned lithographic stack 138 includes one or more openings 140 disposed therein. In one embodiment, patterned lithographic stack 138 includes one or more layers such as, for instance, an optical dispersive layer, an anti-reflective coating (ARC) disposed over the optical dispersive layer and a patterned resist mask disposed over the anti-reflective coating layer.

By way of example, the optical dispersive layer (if present) may be provided using conventional deposition processes. As is known, such a layer functions to refract portions of light waves that pass through it, so as to provide greater accuracy in subsequent lithography processing. As one example, the optical dispersive layer may be any of those conventionally employed during a pattern transfer process, such as ODL 63 or HM8006. The anti-reflective coating layer may be, for instance, a silicon anti-reflective coating layer (SiARC), which is deposited over the optical dispersive layer to minimize any pattern distortion due to reflections. The anti-reflective coating may include materials having silicon and nitrogen, silicon and oxygen, or silicon, oxygen and nitrogen, or an organic polymer, or combinations thereof. In another example, the anti-reflective coating layer may include or be fabricated of, for instance, a bottom anti-reflective coating layer (BARC). In a specific example, the bottom anti-reflective coating layer (BARC) includes conventional inorganic coating materials such as titanium, titanium dioxide, titanium nitride, chromium oxide, carbon or α-silicon. In another example, the anti-reflective coating layer may also include a conventional organic coating material, such as a light-absorbent material, or a polymer material or combinations thereof. As is known, the patterned photoresist, which protects underlying layers in the direction of etching during the subsequent etch processing, may include, for instance, organic photoresist materials, non-organic materials, or combinations thereof.

Figure 1H:
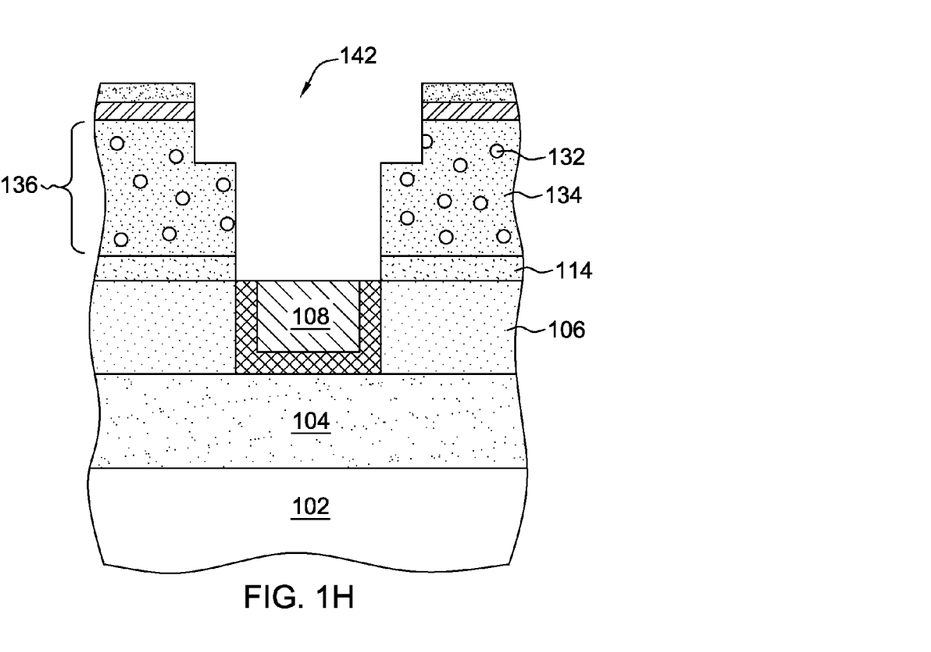
FIG. 1H depicts the structure of FIG. 1G with a via opening having been patterned within the treated interlayer structure, in accordance with one or more aspects of the present invention.

FIG. 1H illustrates the structure of FIG. 1G after performing one or more patterning and etch processes, resulting in removal of a portion of first hard-mask layer 124 and treated interlayer structure 136 to form one or more via openings 142. By way of example, via opening(s) 142 may be formed by employing one or more lithographic processing steps, which may include, for instance, an anti-reflective coating open step and a hard-mask open step. Note that, in one embodiment, because the pulse laser annealing of the interlayer structure facilitates polymerizing the dielectric material, without collapsing and/or shrinking of polymeric dielectric material 134, structural integrity of treated interlayer structure 136 may be maintained, during these etching processes, notwithstanding pores 132 being disposed therein. Note also that, although the etching process may proceed through some pores 132, the structure will continue to maintain its structural integrity. Patterning of the structure of FIG. 1G may be accomplished using any suitable lithography process to achieve via opening 142 having a desired depth. Following patterning, material removal may be performed by, for example, any suitable etching process, such as anisotropic dry etching process, for instance, reactive ion etching (RIE) in sulfur hexafluoride ($SF_6$). In this example, via opening 142 extends through treated interlayer structure 136, stopping at capping layer 114. Note that, when an etchant that is selective to the material of capping layer 114 is used, etching will naturally be stopped at capping layer 114, protecting materials therebelow. Capping layer 114 may then be selectively removed, for instance, using a different etch chemistry, for example, dry etching, resulting in exposing conductive structure 108 disposed within pre-metal dielectric layer 106.

Continuing further with FIG. 1H, the patterned lithographic stack 138 (see FIG. 1H) may be removed. By way of example, the patterned lithographic stack may be removed by subjecting the structure to one or more suitable ashing and/or stripping processes. In one example, the ashing process may include one or more dry etching processes involving reactive plasma such as, for example, oxygen or nitrogen/hydrogen plasma. In another example, the ashing process may be performed employing wet etching processes such as sulfuric acid ($H_2SO_4$) and hydrogen peroxide ($H_2O_2$) mixture (referred to herein as SPM mixture).

Figure 1I:
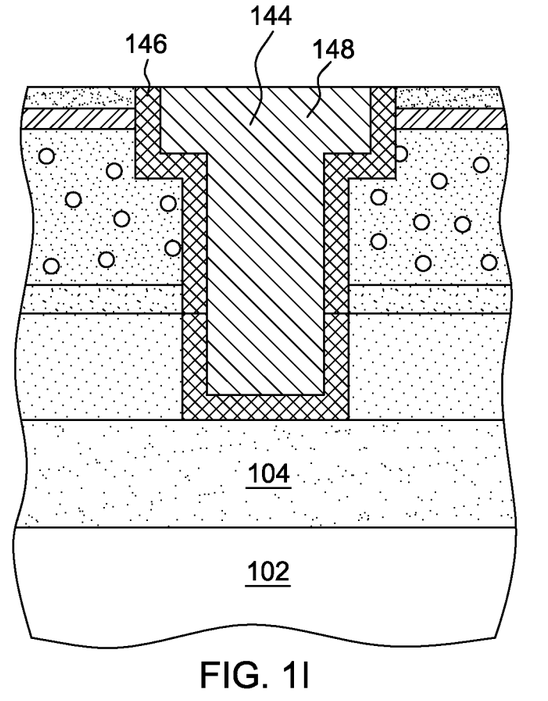
FIG. 1I depicts the structure of FIG. 1H after providing conductive material within the via opening to form a conductive structure, in accordance with one or more aspects of the present invention.

FIG. 1I illustrates the structure of FIG. 1H after performing metallization processes to provide a conductive structure(s) 144 within the via opening(s). In one example, the conductive structure(s) 144 may include liners 146 deposited within via opening(s) 142. A liner refers generally to any film or layer which may include part of the conductive structure, and include (for instance) one or more conformally-deposited layers, which may include titanium (Ti), carbon-doped titanium, tungsten (W), tungsten nitride (WN), titanium nitride (TiN), tantalum nitride (TaN), titanium aluminum nitride (TiAlN) or the like. Liners 146 may be deposited using ALD, CVD or any other suitable processes. Conductive structure 144 may be completed by filling the remaining portion of the via opening(s) with a conductive material 148 such as a metal, for instance, copper, tungsten or the like.

FIGS. 2A-2K depict another enhanced approach for increasing elasticity modulus of an interlayer structure for use, for instance, in fabricating an integrated circuit structure.

Figure 2A:
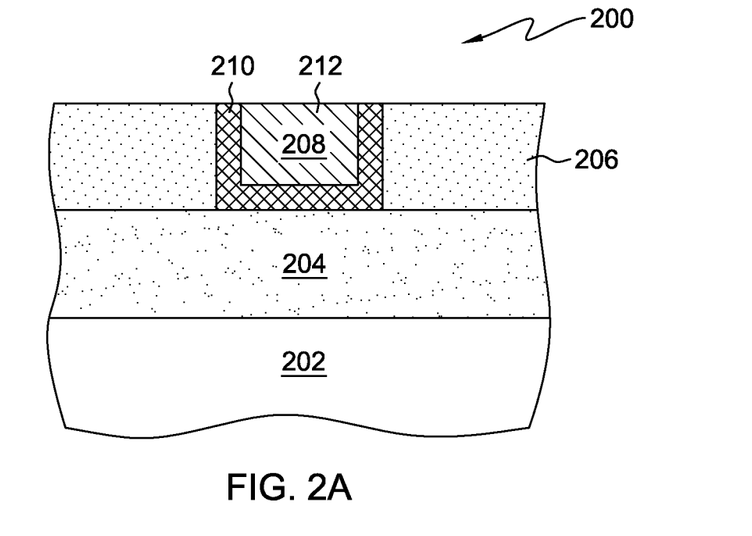
FIG. 2A is a partial cross-sectional elevational view of another embodiment of a circuit structure obtained during a fabrication process, in accordance with one or more aspects of the present invention.

Beginning with FIG. 2A, a partial cross-sectional, elevational view of one embodiment of an intermediate structure 200 is depicted. Intermediate structure 200 includes a substrate 202, such as a semiconductor substrate (for instance, a silicon substrate). As another example, substrate 202 may include any silicon-containing substrate including, but not limited to, silicon (Si), single-crystal silicon, polycrystalline Si, amorphous Si, silicon-on-nothing (SON), silicon-on-insulator (SOI), or silicon-on-replacement insulator (SRI) substrates or the like. The substrate may include other suitable elementary semiconductors, such as, for example, germanium (Ge) in crystal, or a compound semiconductor such as silicon carbide (SiC), gallium arsenide (GaAs), gallium phosphide (GaP), indium phosphide (InP), indium arsenide (InAs), and/or indium antimonide (InSb) or combinations thereof; or an alloy semiconductor including GaAsP, AlInAs, GaInAs, GaInP, or GaInAsP or combinations thereof.

As discussed above, during front-end of line (FEOL) processing, individual devices are created, for instance, in a device layer 204 disposed over substrate 202. As an example, these individual devices may include, for instance, metal-oxide-semiconductor field-effect transistors (MOSFETs) such as FinFETs, as well as capacitors, resistors and other semiconductor devices. Such devices may be formed using various techniques, and their formation may include several steps of processing such as creating surface structures, isolating devices with shallow or deep trenches, forming n-type and p-type wells, providing gate structures, and fabricating source and drain conductive contact structures. Through these techniques, individual, unconnected (or at least partially connected) semiconductor devices may be fabricated in device layer 204.

After FEOL processing, as well as middle-of-the-line (MOL) processing, back-end of line (BEOL) processing is performed. By way of example, the BEOL processing may include, for instance, silicidation of source and drain regions, deposition of a pre-metal dielectric (PMD) layer, and formation of vias or trenches in the PMD layer. During BEOL processing, a pre-metal dielectric (PMD) layer 206 may be deposited and patterned with a network of interconnecting conductive structures (also referred to as interconnecting lines or wiring), for instance, to facilitate the desired interconnection of semiconductor devices in device layer 204 as required to implement a particular integrated circuit design. The deposition of pre-metal dielectric (PMD) layer 206, followed by subsequent processing to pattern, etch and fill trenches and vias with, for instance, conductive structures 208, may be repeated during BEOL processing such that several metal layers, for example, six to ten metal layers, are deposited and processed in a similar manner. Between each metal layer, interlayer structures may be formed to, for instance, isolate signals from the various metal layers and support structural integrity of the integrated circuit structure, including the metal layers and the interconnecting conductive structures such as trenches or vias. As an example, the interlayer structures may include one or more interlayer dielectrics.

By way of example, pre-metal dielectric layer 206 may be patterned using conventional etch processes to define one or more interconnecting conductive structure(s) 208. The etch processes may include conventional anisotropic dry etching processing, for example, reactive ion etching or anisotropic wet etching processes. In one example, conductive structure 208 may include liners 210 deposited within the patterned openings. A liner refers generally to any film or layer which may include part of the resultant conductive structure, and include (for instance) one or more conformally-deposited layers, which may include titanium (Ti), carbon doped titanium, tungsten (W), tungsten nitride (WN), titanium nitride (TiN), tantalum nitride (TaN), titanium aluminum nitride (TiAlN) or the like. Liners 210 may be deposited using conventional deposition processes, for example, atomic layer deposition (ALD), chemical vapor deposition (CVD) or any other suitable process, and facilitate the forming of conductive structures 208 by the subsequent filling of the openings with a conductive material 212, such as a metal, such as copper, tungsten or the like. A non-selective chemical-mechanical polish may be employed to polish away excess liners 210 and conductive material 212, along with pre-metal dielectric layer 206 with the chemical-mechanical polishing terminating at, for instance, conductive structure(s) 208, resulting in the height of conductive structure 208 being substantially equal to height of pre-metal dielectric layer 206 as illustrated.

Figure 2B:
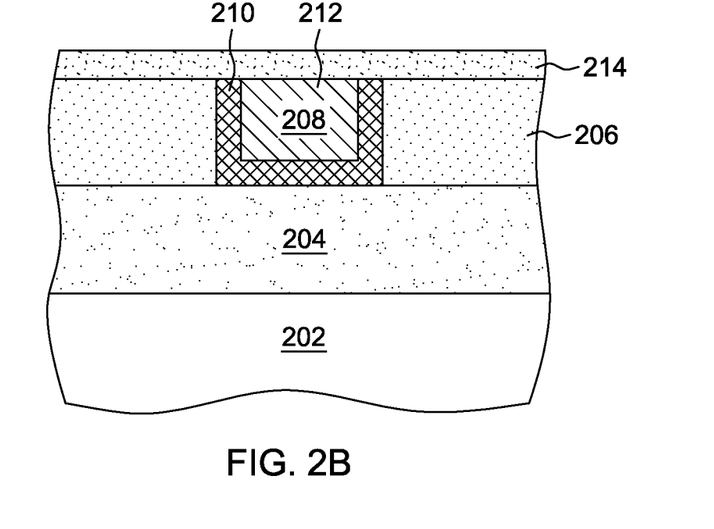
FIG. 2B depicts the structure of FIG. 2A with a capping layer having been provided over the structure, in accordance with one or more aspects of the present invention.

FIG. 2B illustrates the structure of FIG. 2A, after providing a capping layer 214 over the structure. In one example, capping layer 214, may have a thickness in the range of about 5.0 to 50.0 nanometers, and may be deposited using conventional deposition processes such as, for instance, atomic layer deposition (ALD), chemical vapor deposition (CVD) or the plasma-enhanced versions of the same. Capping layer 214 may be or include a dielectric material such as, for instance, a nitrogen-doped or hydrogen-doped silicon carbide material (also referred to as an N-Blok material). In another example, capping layer 214 may also include or be fabricated of materials such as, for example, silicon nitride (SiN), silicon carbide (SiC), silicon carbonitride (SiCN) or a combination thereof. In a specific example, capping layer 214 may have a thickness of about 30 nanometers.

Figure 2C:
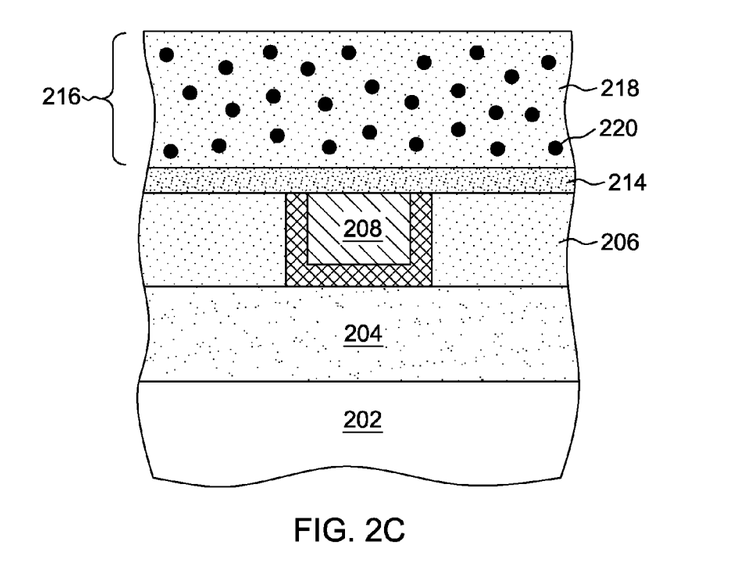
FIG. 2C depicts the structure of FIG. 2B after providing an interlayer structure, which includes porogens dispersed within a dielectric material, in accordance with one or more aspects of the present invention.

FIG. 2C depicts the structure of FIG. 2B, after providing an interlayer structure 216 over the structure, in accordance with one or more aspects of the present invention. In one embodiment, interlayer structure 216 includes or is fabricated of a dielectric material 218 with porogens 220 dispersed therein. Dielectric material 218 may be deposited from a gaseous phase using chemical vapor deposition (CVD) such as, for example, plasma-enhanced CVD (PECVD), or from a liquid phase using a spin-on deposition process and, by way of example, may have a thickness in the range of about 50.0 to 500.0 nanometers. In one example, dielectric material 218 may include or be fabricated of an organosilane precursor having one or more chemically unstable reactive species and, in one embodiment, may be represented by a general chemical formula $R^1{}_n(OR^2)_{3-n}Si$, where n=2 or 3, $R^1$ can be independently H, $C_1$ to $C_4$, linear or branched, saturated, singly or multiply unsaturated, cyclic, partially or fully fluorinated, $R^2$ can be independently $C_1$ to $C_6$, linear or branched, saturated, singly or multiply unsaturated, cyclic, aromatic, partially or fully fluorinated and $R^1$ may be different from $R^2$. In a specific example, the organosilane precursor may include, but not be limited to, diethoxymethylsilane (DEMS, having a chemical formula of $C_5H_{14}O_2Si$), dimethoxymethylsilane, di-isopropoxymethylsilane, dimethyldi-isopropoxysilane, dimethyoxymethylvinylsilane, tetraethoxysilane, 1,2-dimethyl-1-acetoxy-2-ethoxydisilane, vinyltriethoxysilane (VTEOS) and combinations thereof. In another example, dielectric material 218 may include or be fabricated of an organosiloxane precursor such as, for example, tetramethylcyclotetrasiloxane, octamethylcyclotetrasiloxane, pentamethylcyclopentasiloxane, hexamethylcyclotrisiloxane, dimethyldisiloxane, and combinations thereof.

Further, and as noted, interlayer structure 216 includes porogens 220 dispersed within dielectric material 218. Porogens 220 are particles that may be degraded, or removed leaving pores, using, for example, processing techniques such as discussed below with reference to FIG. 2H. Porogens 220 may include or be fabricated of an alkenyl-containing precursor. In one example, the alkenyl-containing precursor may include, but not be limited to, alpha-terpinene (ATRP), bicyclo[2.2.1]hepta-2,5-diene (BCHD) (also referred to as 2,5-norbornadiene), para-cymene (PCM), trivertal. In another example, porogens may include or be fabricated of polymers such as, for example, polymethylmethacrylate and other acrylates, polystyrene, poly(propylene oxide) and poly(ethylene oxide) derivatives. Porogens 220, which may be nanoparticles, may be roughly spherical in shape, or may have irregular shapes and sizes, and may or may not be uniformly dispersed within dielectric material 218. In one example, two or more porogens 220 may be randomly in direct contact with one another, while in another example, porogens 220 may be uniformly distributed.

Figure 2D:
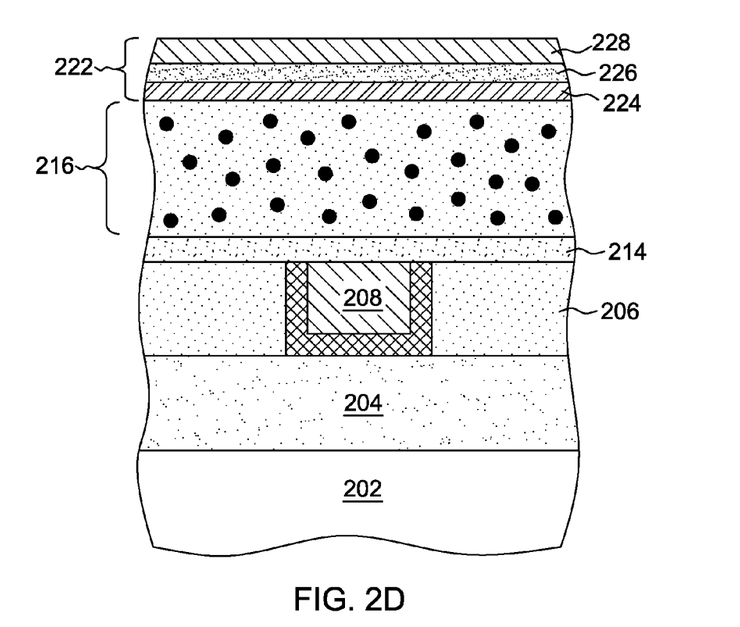
FIG. 2D depicts the structure of FIG. 2C with one or more protective layer(s) having been provided over the interlayer structure, in accordance with one or more aspects of the present invention.

FIG. 2D depicts the structure of FIG. 2C with one or more protective layer(s) 222 having been provided over interlayer structure 216. By way of example, protective layer(s) 222 may be used, in a subsequent processing step, to support patterning and forming of via openings in the underlying interlayer structure 216. Protective layer(s) 222 may include, for instance, a first hard mask layer 224 and a second hard mask layer 226 disposed over first mask layer 224. The deposition process may include any conventional process such as, for example, low temperature CVD, plasma-enhanced CVD or atomic layer deposition (ALD). In one example, first hard mask layer 224, may have a thickness in the range of about 3.0 to 30.0 nanometers, and may include or be fabricated of one or more layers of silicon-containing materials or carbon-containing materials. In one example, the silicon-containing material may include, for example, silicon oxide ($Si_xO_y$), silicon nitride ($Si_xN_y$), silicon oxynitride ($Si_xO_yN_z$), tetraethyl orthosilicate (TEOS), or octamethylcyclotetrasiloxane (OMCTS) layer, while the carbon-containing material may include, for example, silicon oxycarbide ($Si_xO_yC_z$) or carbon (diamond-like carbon (DLC), amorphous carbon (a-C) or graphite). In a specific example, first hard mask layer 224 may be a layer of octamethylcyclotetrasiloxane (OMCTS) formed with a desired thickness, for instance, 15 nm. In another specific example, first hard-mask layer 224 may be a layer of tetraethyl orthosilicate (TEOS) formed, for instance, by CVD processing to a desired thickness, for instance, 20 nm.

As noted, second hard-mask layer 226 may be provided over first hard-mask layer 224. In one embodiment, second hard-mask layer 226 may have a thickness in the range of about 5.0 to 50.0 nm, and may be deposited using any conventional deposition processes such as CVD, PVD or ALD. By way of example, second hard-mask layer 226 includes or is fabricated of a metal or a metal-containing material. Second hard-mask layer 226 may be or include, for example, titanium (Ti), titanium nitride (TiN), tantalum nitride (TaN), tantalum (Ta), aluminum (Al) or aluminum-copper alloy (Al—Cu). In one specific example, second hard-mask layer 226 may have a thickness in the range of about 40 nanometers. An additional layer of a third hard-mask material 228 may optionally be provided over second hard-mask layer 226. In one embodiment, third hard-mask layer 228 may include or be fabricated of a silicon-containing material, a carbon-containing material, a metal or a metal-containing material.

Figure 2E:
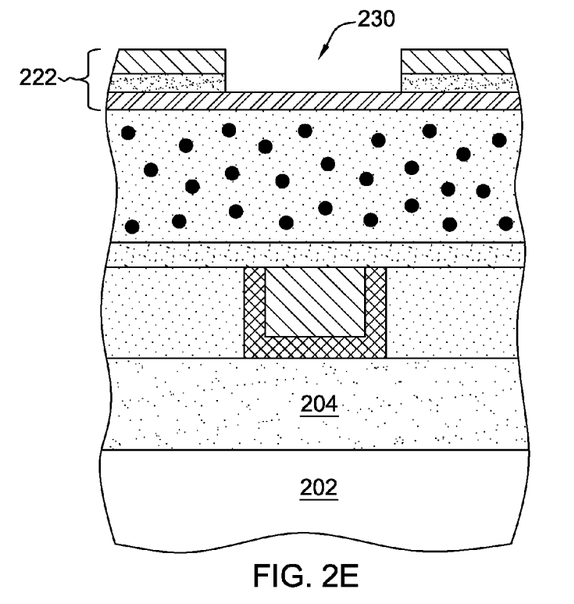
FIG. 2E depicts the structure of FIG. 2D after partial patterning of the protective layer(s), in accordance with one or more aspects of the present invention.

One or more etch processes may be performed to pattern protective layer(s) 222 (see FIG. 1D), forming one or more openings 230 within protective layer(s) 222, as depicted in FIG. 2E. By way of example, these one or more etch processes may include one or more hard-mask open steps, which may be performed employing any conventional etch process, such as an anisotropic etching process or an isotropic etching process. Note that, in one implementation, the one or more hard-mask open step(s) forms an opening extending through optional third hard-mask layer 228 and underlying second hard-mask layer 226, stopping on first hard-mask layer 224. In one example, one or more etch processes may be utilized at this stage, including (for example) an anti-reflective coating open step, an optical dispersion layer open step, and one or more hard mask open steps.

Figure 2F:
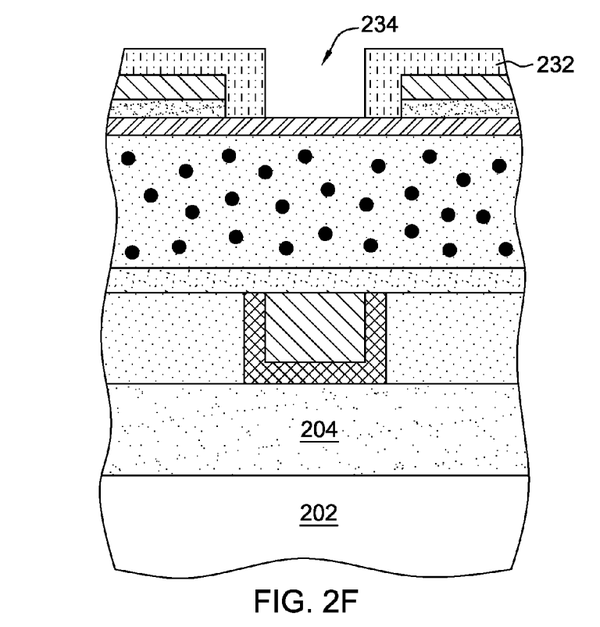
FIG. 2F depicts the structure of FIG. 2E after providing a lithographic stack over the partially patterned protective layer(s), in accordance with one or more aspects of the present invention.

As depicted in FIG. 2F, a patterned lithographic stack 232 may optionally be provided over the structure, and in particular, over partially patterned protective layer(s). Note that, in one embodiment, a lithographic stack may be provided and selectively patterned to define openings 234 disposed therein. In one embodiment, patterned lithographic stack 232 includes one or more layers such as, for instance, an optical dispersive layer, an anti-reflective coating (ARC) disposed over the optical dispersive layer and a patterned resist mask disposed over the anti-reflective coating layer.

By way of example, the optical dispersive layer (if present) may be provided using conventional deposition processes. As is known, such a layer functions to refract portions of light waves that pass through it, so as to provide greater accuracy in subsequent lithography processing. As one example, the optical dispersive layer may be any of those conventionally employed during a pattern transfer process, such as ODL 63 or HM8006. The anti-reflective coating layer may be, for instance, a silicon anti-reflective coating layer (SiARC), which is deposited over the optical dispersive layer to minimize any pattern distortion due to reflections. The anti-reflective coating may include materials having silicon and nitrogen, silicon and oxygen, or silicon, oxygen and nitrogen, or an organic polymer, or combinations thereof. In another example, the anti-reflective coating layer may include or be fabricated of, for instance, a bottom anti-reflective coating layer (BARC). In a specific example, the bottom anti-reflective coating layer (BARC) includes conventional inorganic coating materials such as titanium, titanium dioxide, titanium nitride, chromium oxide, carbon or α-silicon. In another example, the anti-reflective coating layer may also include a conventional organic coating material, such as a light-absorbent material, or a polymer material or combinations thereof.

As is known, the patterned photoresist, which protects underlying layers in the direction of etching during the subsequent etch processing, may include, for instance, organic photoresist materials, non-organic materials, or combinations thereof.

Figure 2G:
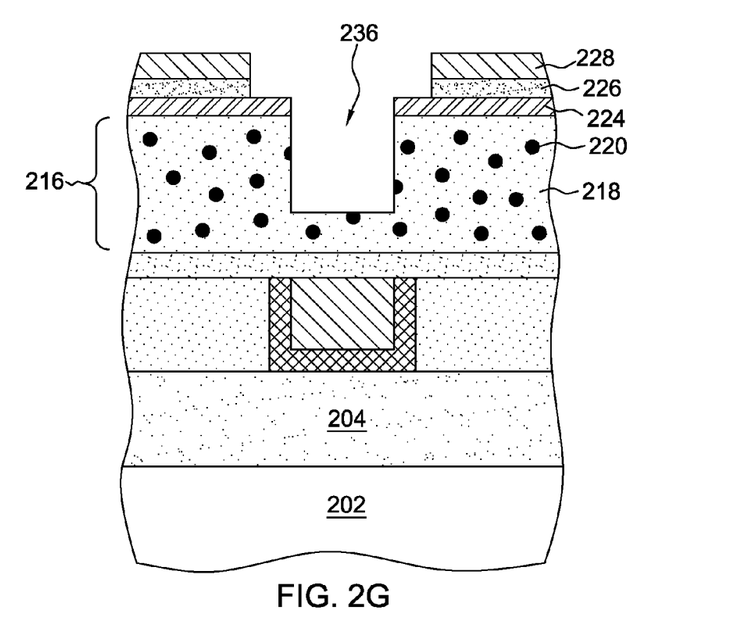
FIG. 2G depicts the structure of FIG. 2F with a via opening having been patterned within the interlayer structure, in accordance with one or more aspects of the present invention.

FIG. 2G illustrates the structure of FIG. 2F after performing one or more patterning and etch processes, resulting in removal of a portion of first hard-mask layer 224 and interlayer structure 216 to form one or more via openings 236. By way of example, via opening(s) 236 may be formed by employing one or more lithographic processing steps, which may include, for instance, an anti-reflective coating open step and a hard-mask open step. Note that, in one embodiment, during subsequent processing, via openings 236 may be filled with a conductive structure, such as one or more metal lines, which support electrical connection along a horizontally-extending length. Note also that, etching of interlayer structure 216 results in formation of via openings 236 with smooth, solid sidewalls without etch or ash damage, which may occur when porous materials are used. During the etching, some porogens 220 may be partially etched but the materials will continue to remain structurally robust. In this example, patterning of the structure of FIG. 2F may be accomplished using any suitable lithography process to achieve via openings 236 of a desired depth. Following patterning, material removal may be performed by, for example, any suitable etch process, such as an anisotropic dry etching process, for instance, reactive ion etching (RIE) in sulfur hexafluoride ($SF_6$).

The patterned lithographic stack 232 (see FIG. 2F) may subsequently be removed. By way of example, the patterned lithographic stack may be removed by subjecting the structure to one or more suitable ashing and/or stripping processes. In one example, the ashing process may include one or more dry etching processes involving reactive plasma such as, for example, oxygen or nitrogen/hydrogen plasma. In another example, the ashing process may performed employing wet etching processes such as sulfuric acid ($H_2SO_4$) and hydrogen peroxide ($H_2O_2$) mixture (referred to herein as SPM mixture).

Figure 2H:
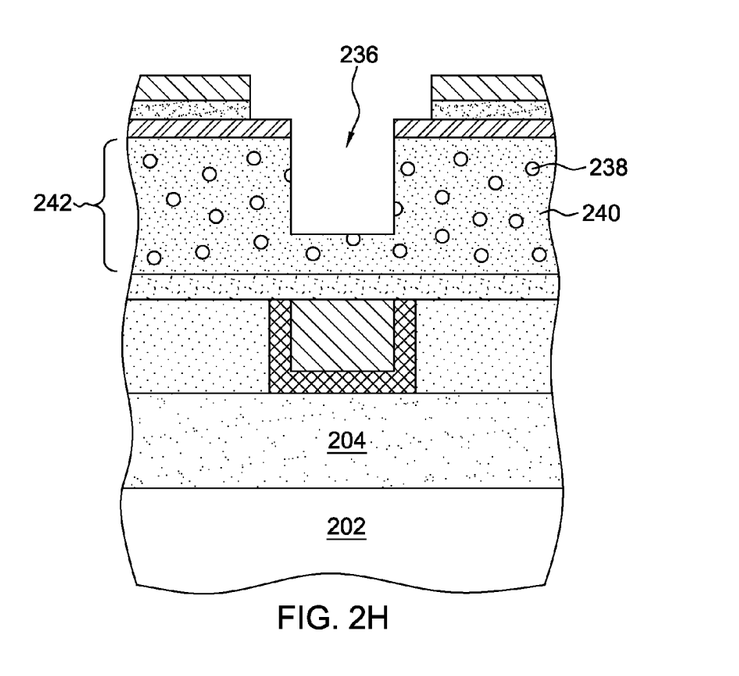
FIG. 2H depicts the structure of FIG. 2G with a treated interlayer structure having been formed after pulse laser annealing the interlayer structure, in accordance with one or more aspects of the present invention.

Referring to FIG. 2H, the structure may next be subjected to one or more processing steps to facilitate degrading at least a portion of the porogens dispersed within the interlayer structure, leaving pores 238 therein. In one example, pores 238 may have a diameter or critical dimension of approximately about 0.3 to 2.0 nanometers. By way of example, the one or more processing steps to degrade the porogens may include annealing the interlayer structure by applying a chuck or wafer pedestal temperature of about 250° C., using any suitable thermal enhancing processing steps. One skilled in the art will recognize that the depicted structure may be placed on a pedestal or other conventional support system such as, for example an electrostatic, vacuum or mechanical chuck in a process chamber. Upon increasing the pedestal temperature during one or more processing steps, at least a percentage of degradable porogens 220 (FIG. 2G) of interlayer structure 216 (FIG. 2G) will transition into a gaseous phase and migrate or bubble through the interlayer structure, thereby leaving the depicted structure of FIG. 2H. The resulting pores 238 may be filled with air or another gas, or may have a partial vacuum therein, depending on the process conditions used. Because the dielectric constant of air or vacuum is approximately one (1), the formation of pores 238 facilitates reducing the dielectric constant of the interlayer structure. In one example, the reduced dielectric constant of the interlayer structure may be within a range of about 2.0 to 3.0.

Continuing with FIG. 2H, a pulse laser annealing process may be performed over the structure, and in particular, over the dielectric material of the interlayer structure. In one embodiment, the pulse laser annealing facilitates causing an interaction between chemically unstable reactive species disposed within the dielectric material, resulting in polymerizing the dielectric material of the interlayer structure to form polymeric dielectric material 240. Note that as discussed above, polymeric dielectric material 240 includes pores 238 disposed therein, which results in a treated interlayer structure 242. The pulse laser annealing of the interlayer structure may be performed by, for instance, controlling process parameters such as, pulse laser energy and laser pulse duration to facilitate removal of only the chemically unstable reactive species of the dielectric material, thereby controlling the extent of polymerization of the dielectric material disposed within treated interlayer structure 242. In one example, the pulse laser annealing may be performed in the presence of process gases such as, for instance, carbon dioxide ($CO_2$) employing a laser pulse duration in the range of about 10 to 200 nanoseconds and at a temperature within a range of about 500° C. to 1500° C. Note that in this example, controlling laser pulse duration of each individual laser pulse facilitates controlling the extent of polymerization of the dielectric material and maintaining the smooth sidewalls along via opening 236, notwithstanding that there are pores 238 disposed within the polymeric dielectric material 240.

Additionally, note that the penetration of pulse laser energy within the interlayer structure depends on process parameters such as, for instance, pulse cycle time, wavelength employed during the process and pulse laser length (also referred to as pulse laser width). Note that, in this example, the pulse laser annealing of the interlayer structure advantageously facilitates altering, for instance, molecular polarizabilities of chemically unstable reactive species, thereby improving chemical cross-linking bonds of the polymeric dielectric material 240. This, in turn, facilitates maintaining the structural integrity of the treated interlayer structure 242 without collapsing and/or shrinking of the polymeric dielectric material, notwithstanding that there are pores 238, as well as via opening 236 disposed therein. Such maintaining of the structural integrity of the treated interlayer structure advantageously facilitates maintaining or slightly enhancing elasticity modulus of the treated interlayer structure 242. In one example, the treated interlayer structure 242 may have an elasticity modulus within a range of about 3.0 to 20.0 GPa, and in one specific example, the pulse laser annealing may be performed employing an infrared (IR) laser beam with a wave length of about 1064 nm for a pulse laser duration of about 200 nanoseconds at a temperature of about 500° C. In another example, the pulse laser annealing may be performed employing a green laser beam with a wavelength of about 532 nm for a pulse laser duration of about 20 to 200 nanoseconds at a temperature of about 500° C. to 1400° C.

Figure 2I:
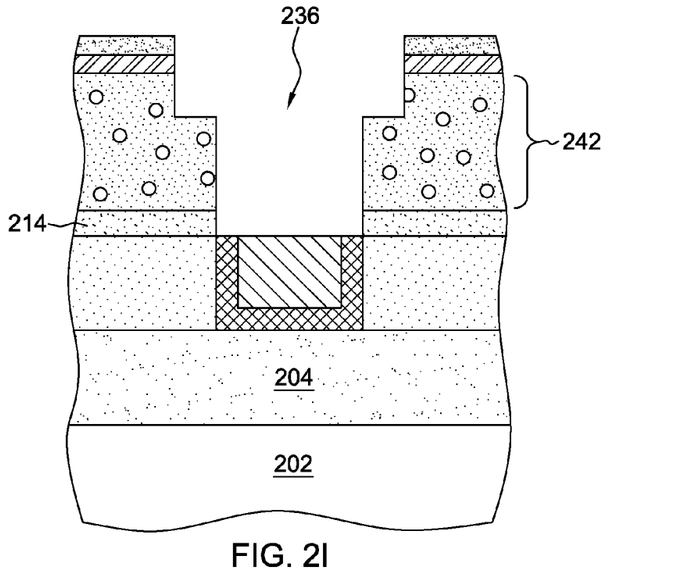
FIG. 2I depicts the structure of FIG. 2H with the via opening extending through the treated interlayer structure, in accordance with one or more aspects of the present invention.

Referring to FIG. 2I, via opening(s) 236 may be patterned and etched to extend through treated interlayer structure 242, initially stopping at capping layer 214. By way of example, via opening(s) 236, during subsequent fabrication processing, may be filled with conductive structures to, for example, facilitate vertical connection between BEOL metal layers of an integrated circuit. In one example, the extending of via opening(s) 236 may be accomplished using any suitable lithography process. Following patterning, material removal may be performed by, for instance, any suitable etching process such as, anisotropic dry etching process, for instance, reactive ion etching (RIE) in sulfur hexafluoride ($SF_6$). When an etchant that is selective to the material of capping layer 214 is used, etching will naturally be stopped at capping layer 214, protecting materials therebelow. Capping layer 214 may then be selectively removed, for instance, using a different etch chemistry, for example, dry etching, resulting in exposing conductive structure 208 disposed within pre-metal dielectric layer 206.

Figure 2J:
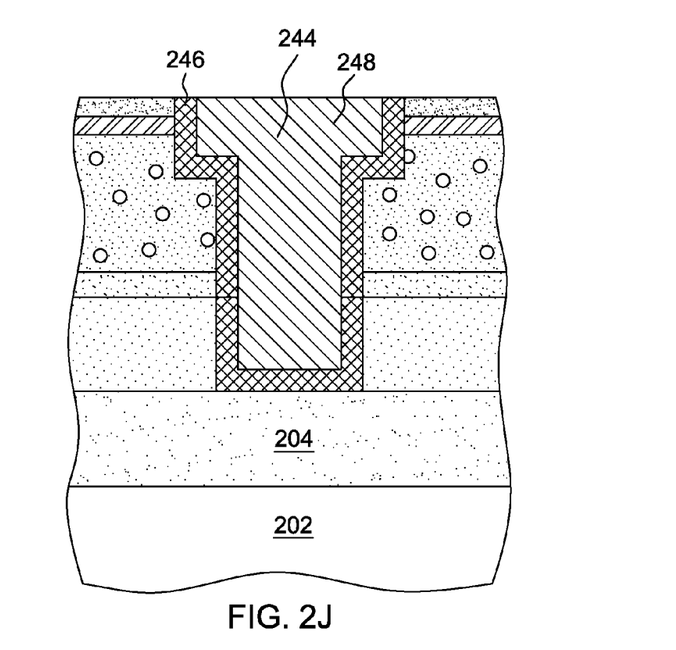
FIG. 2J depicts the structure of FIG. 2I after providing conductive material within the via opening to form a conductive structure, in accordance with one or more aspects of the present invention

FIG. 2J illustrates the structure of FIG. 2I after performing metallization processes to provide a conductive structure(s) 244 within the via opening(s). In one example, the conductive structure(s) 244 may include liners 246 deposited within via opening(s) 236. A liner refers generally to any film or layer which may include part of the conductive structure, and include (for instance) one or more conformally-deposited layers, which may include titanium (Ti), carbon-doped titanium, tungsten (W), tungsten nitride (WN), titanium nitride (TiN), tantalum nitride (TaN), titanium aluminum nitride (TiAlN) or the like. Liners 246 may be deposited using ALD, CVD or any other suitable processes. Conductive structure 244 completed by filling the remaining portion of the via opening(s) with a conductive material 248, such as a metal, for instance, copper, tungsten or the like.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A method comprising:
    fabricating a circuit structure, the fabricating comprising:
        providing an interlayer structure above a substrate, the interlayer structure comprising porogens dispersed within a dielectric material; and
        pulse laser annealing the interlayer structure to form a treated interlayer structure, the pulse laser annealing polymerizing the dielectric material of the interlayer structure to form a polymeric dielectric material, wherein the polymeric dielectric material comprises pores disposed therein, and the pulse laser annealing facilitates increasing elasticity modulus of the treated interlayer structure by, in part, maintaining structural integrity of the treated interlayer structure, notwithstanding the pores disposed therein.

2. The method of claim 1, wherein the fabricating further comprises processing the interlayer structure, prior to the pulse laser annealing of the interlayer structure, to facilitate degrading at least a portion of the porogens of the interlayer structure leaving the pores disposed therein.

3. The method of claim 2, wherein the processing of the interlayer structure facilitates reducing a dielectric constant of the interlayer structure.

4. The method of claim 3, wherein the interlayer structure has a reduced dielectric constant of about 2.0 and 3.0.

5. The method of claim 2, wherein the processing comprises annealing the interlayer structure at a temperature of about 250° C. or less, prior to the pulse laser annealing of the interlayer structure.

6. The method of claim 1, wherein the pulse laser annealing comprises pulse laser annealing the interlayer structure with a laser pulse duration which facilitates polymerizing the dielectric material to form the polymeric dielectric material, wherein the laser pulse duration is selected to control an extent of polymerization of the dielectric material within the treated interlayer structure.

7. The method of claim 6, wherein the laser pulse duration is within a range of about 10 to 200 nanoseconds.

8. The method of claim 1, wherein the pulse laser annealing is performed at a temperature within a range of about 500° C. to 1500° C.

9. The method of claim 1, wherein the pulse laser annealing comprises pulse laser annealing the interlayer structure using a pulse cycle time which facilitates maintaining structural integrity of the treated interlayer structure, wherein the pulse cycle time is selected to inhibit degradation of the interlayer structure.

10. The method of claim 9, wherein the pulse cycle time is further selected to facilitate achieving a desired elasticity modulus for the treated interlayer structure.

11. The method of claim 10, wherein the treated interlayer structure has an elasticity modulus within a range of about 3.0 GPa to 20.0 GPa.

12. The method of claim 1, wherein the dielectric material comprises an organosilane precursor, and the porogen comprises an alkenyl-containing precursor.

13. The method of claim 1, wherein the fabricating further comprises forming at least one via opening within, at least in part, the interlayer structure, prior to the pulse laser annealing the interlayer structure, wherein the at least one via opening extends through the interlayer structure.

14. The method of claim 13, wherein the fabricating further comprises processing the interlayer structure, prior to the pulse laser annealing of the interlayer structure, to facilitate degrading at least a portion of the porogens of the interlayer structure leaving the pores disposed therein, wherein the processing of the interlayer structure is subsequent to the forming of the at least one via opening.

15. The method of claim 14, wherein the processing of the interlayer structure also facilitating reducing a dielectric constant of the interlayer structure.

16. The method of claim 14, wherein the interlayer structure has a reduced dielectric constant of about 2.0 to 3.0.

17. The method of claim 13, wherein the pulse laser annealing comprises pulse laser annealing the interlayer structure with a laser pulse duration which facilitates polymerizing the dielectric material to form the polymeric dielectric material, wherein the laser pulse duration is selected to control an extent of polymerization of the dielectric material within the treated interlayer structure.

18. The method of claim 13, wherein the pulse laser annealing comprises pulse laser annealing the interlayer structure using a pulse cycle time which facilitates maintaining structural integrity of the treated interlayer structure, wherein the pulse cycle time is selected to inhibit degradation of the treated interlayer structure.

19. The method of claim 13, further comprising, after pulse laser annealing the interlayer structure, providing a conductive structure within the at least one via opening of the treated interlayer structure.

20. The method of claim 13, wherein the treated interlayer structure has an elasticity modulus within a range of about 3.0 GPa to 20.0 GPa.

* * * * *